United States Patent [19]

Edwards

[11] Patent Number: 4,554,241

[45] Date of Patent: Nov. 19, 1985

[54] COLOR REPRODUCTION PROCESS

[76] Inventor: Wallace Edwards, P.O. Box 1265, Station B, Weston, Ontario, Canada, M9G 2R9

[21] Appl. No.: 712,659

[22] Filed: Mar. 18, 1985

Related U.S. Application Data

[63] Continuation-in-part of Ser. No. 595,815, Apr. 2, 1984, abandoned, which is a continuation-in-part of Ser. No. 485,668, Apr. 18, 1983, abandoned.

[51] Int. Cl.$^4$ ............................................. G03F 7/00
[52] U.S. Cl. .................................... 430/301; 430/44; 430/367; 430/396; 101/211
[58] Field of Search ................. 430/301, 44, 396, 367; 101/211

[56] References Cited

U.S. PATENT DOCUMENTS

| | | | |
|---|---|---|---|
| 611,457 | 9/1898 | McDonough | 101/211 |
| 930,689 | 8/1909 | Rheinberg | 101/211 |
| 2,349,819 | 5/1944 | Fitz | 430/22 |
| 2,997,389 | 7/1961 | Boon | 430/396 |
| 3,253,917 | 5/1966 | Flynn | 430/301 |
| 3,376,133 | 4/1968 | Roteman | 101/211 |
| 3,458,310 | 7/1969 | Arneth et al. | 430/301 |
| 3,901,707 | 7/1975 | Capute | 430/396 |
| 3,939,769 | 2/1976 | Lorber | 430/301 |
| 4,510,223 | 4/1985 | Kuehnle et al. | 430/44 |

OTHER PUBLICATIONS

"Multicolor Effects on Two Color Presses", Dupont Magazine, Sep.–Oct. 1968, vol. 62, No. 5, E. I. DuPont de Nemours, Wilmington, Del.
The Lithographers Manual, vol. 1, Jan. 1958, pp. 6:10, 6:11, 7:29, 7:39, 7:40 and 7:41, Waltwin Publishing Co., New York, N.Y.

*Primary Examiner*—J. Travis Brown
*Attorney, Agent, or Firm*—Sim & McBurney

[57] ABSTRACT

A method of printing on a sheet member a realistic image of an original, uses two different superimposed impressions with two different coloring media. A first printing plate is created by interposing at least two filters between the original and the film or photoconductive surface, and a second printing plate is created by interposing at least one filter between the original and the film or photoconductive surface. Then, the two printing plates are used to print the different impressions with two different coloring media.

11 Claims, No Drawings

COLOR REPRODUCTION PROCESS

This is a continuation-in-part of U.S. application Ser. No. 595,815, filed April 2, 1984, now abandoned, with the same title, which in turn was a continuation-in-part of U.S. application Ser. No. 485,668, filed April 18, 1983, now abandoned, and entitled "Color Reproduction Process".

This invention relates generally to the printing industry, and has to do particularly with a process for the generation of the plates necessary to permit color printing. Even more particularly, the present invention sets forth a method of reducing the number of individual plates which need to be made to satisfactorily reproduce a given colored picture, painting, transparency or the like.

BACKGROUND OF THIS INVENTION

Currently, a process known as the four-color separation process is very widely used in the printed reproduction of colored pictures, transparencies and the like. The four-color separation process is generally responsible for all of the high-quality colored reproductions in magazines and books, and is also used for some newspaper work as well.

In the most common version of this process, the original print or transparency is photographed through different filters to produce different individual films which correspond to the basic colors of the four-color separation process: yellow, magenta, cyan and black. The filters utilized to extract the first three of these colors from the original have tints which are the complementary colors of the colors being drawn out. Thus, a green filter is used to pick out the magenta, a blue filter is used to pick out the yellow, and a red filter is used to pick out the cyan. A combination of all filters is ideally utilized to pick out the black, although in some processes the black film is made by photographing the original in black-and-white film, without any filter.

Some "fine tuning" or adjustment of the intensities of the various colors in the process is made by selecting exposure times and development times. Also, in some instances the final inks used to print the final reproduction can be varied and selected to attain certain effects.

From the four pieces of film produced through this process, printing plates are made, these being subsequently attached to plate cylinders in a typical printing machine, which is then able to print the reproduction using the process colors; yellow, magenta, cyan and black.

Generally speaking, the printing industry is of the view that proper reproduction of any photograph or the like requires a four-color separation process of the kind just described, utilizing the process ink colors.

However, in certain branches of the printing industry, particularly in newspapers, shopping bags, the Yellow Pages and advertising flyers, the full four-color separation process represents a considerable expense, since it requires the material to be passed through four printing stations, in order to receive the four colors. This in turn requires the production of four plates, and the time required to mount them, adjust the components, etc. All of this represents a substantial cost factor which, for obvious reasons, it would be of advantage to reduce.

There is a two-ink process forming part of the prior art, known as duotone. In one version of this process, often called "Fake" duotone, a black and white original (for example a photograph) is first photographed on "Ortho" film through a contact screen to give a screen film. "Ortho" film is a high contrast film which is not sensitive to the red region of the spectrum. Then, the same screen is rotated through 30° and another screen film is taken, substantially identical to the first, also on "Ortho" film. The two films are developed to different densities, then are used to make plates which are run in two colors, for example, red and black.

In another version of duotone, often called "Real" duotone, the original art is already in two colors, for example, red and black. The first step is to shoot "Ortho" film through a grey contact screen without any filter. Both the red and the black will be seen by the film, and the result will be a film in which the red and the black are both picked up as black. Then, a panchromatic film is exposed through a red filter and a grey contact screen. In this arrangement, the film sees only black.

The two films are then used to make plates which print red and black, respectively.

It is also known, particularly in the food advertising area where blue colors are rare, to do a three-color separation using the standard filters to obtain yellow, magenta and cyan, and then to print the image using yellow ink, red ink and black ink. In other words, the plate made from the cyan film prints in black ink.

It is further known to mix various colors to produce various other colors. For example, it is known to print a dot matrix of black superimposed on a dot matrix of yellow in order to produce various shades of green. It is also known that red and yellow will combine in the same way to produce orange. It is further known that yellow and cyan will combine to produce various shades of green.

I have now discovered and developed a process by which to attain strikingly realistic reproductions of an original utilizing only two printing plates inked with only two different colors. However, the process of making these plates does not involve simply one of the known parts of the standard four-color separation, nor does it utilize process inks.

By way of explaining this, it should be understood that, if a four-color separation were made to produce four plates intended to print yellow, magenta, cyan and black, and then if only the yellow and red were printed, or only the yellow, blue and black, or any other combination which was not the full combination of four colors, the resulting print would be clearly and definitely unbalanced, and anyone viewing the print would immediately see the unbalanced nature of the colors. The print would appear "too reddish" or "too far into the blue region", or blotchy. The aim of the process which I have developed is to remove the unbalanced nature of a printed reproduction made with only two impressions, and thus two inks.

GENERAL DESCRIPTION OF THIS INVENTION

Simply stated, the improvement which I have developed consists in making a red printer by utilizing sequentially a green filter and a blue filter, and making a printer for another color such as green, blue or black by utilizing sequentially a red filter and a blue filter.

More particularly, this invention provides a method of printing on a sheet member a realistic reproduction of a colored original, utilizing a minimum of two different superimposed impressions, each with a different coloring medium, comprising:
(a) providing a colored original,
(b) creating a first printing plate intended to print a non-process red color, by
  (1) making a green filter exposure of the original on a first means for recording a first optical image,
  (2) making a blue filter exposure of the original on said first means,
steps (1) and (2) being carried out sequentially in any order,
(c) creating a second printing plate intended to print a second color different from that printed by said first plate, by
  (3) making a red filter exposure of the original on a second means for recording a second optical image,
  (4) making a blue filter exposure of the original on said second means,
steps (3) and (4) being carried out sequentially in any order,
steps (b) and (c) being carried out in any order,
(d) providing a sheet member to receive two superimposed impressions, and
(e) using said first and second printing plates to print said red color and said different color, respectively, as the said superimposed impressions on said sheet member.

DETAILED DESCRIPTION OF THIS INVENTION

This invention will first be described as it relates to the printing industry, and subsequently as it relates to the copying industry.

When used in the photographic reproduction area, the method of this invention involves making two films by exposure to the original, both of the films being made by the interposition of two filters between the original and the film during exposure, or by illuminating the original with two filtered or monochromatic lights, as is done in the conventional scanners operating on the rotating drum principle. Each film is exposed sequentially through the two filters or with the equivalent two lights on the conventional scanner.

An important aspect of this invention is the emphasis on the color red as one of the non-process colors which would normally always be used in this process. Those familiar with the various shades of process colors will know that the process ink magenta is quite different from a true red, in that the magenta does not have any of the warmth of the true red color. The magenta is more like a deep pink, but is a very cool shade, as compared to a true red. Typically, a true red color requires a printing of the process magenta color over the process yellow, with the yellow adding the necessary "warmth" to make a true red. However, as the present process proposes to use only two inks printed by two plates, there is not the luxury of being able to combine colors to make the desired end shade, as is done in the four-color process. Instead, I propose to use a true "warm" red as one of the two printing inks. Warm red is a very appropriate color to be consistently used in this method, because it forms a major part of most photographic subject matter, whether it be food (meat, red vegetables etc.), or skin tones where human subjects are involved.

A "warm" red color has contributions from both magenta and yellow, and therefore it is appropriate to utilize, in the manufacture of the red printer, the two filters which normally yield magenta and yellow separations in the four-color process, namely green and blue filters, respectively.

I would then make a printer intended to print green, although I have found that this second printer could also be inked with blue, black or other colors while still creating a striking, true-to-life picture. In the four-color process, green is not a process color, i.e. not one of the inks that is used to make the end product. The color green is normally made by superimposing a cyan ink on top of a yellow ink. However, again there is not the luxury of having a plurality of superimposed colors to make the green, and therefore, in one aspect of this invention, it is proposed to print using a true green ink. Because green is a combination of cyan and yellow in the four-color process, the present method creates the green printing plate by utilizing firstly a red filter and then a blue filter, since these normally yield cyan and yellow in the conventional four-color process.

As a general rule I have found that the best results arise, when making the red printer, by using a green filter exposure time of no less than a normal exposure time for making a magenta printing plate in the conventional four-color process, and preferably slightly longer. More particularly the green filter exposure would typically be about 5% longer than normal. The blue filter exposure for the red printer, however, is substantially less than a typical blue filter exposure intended to obtain a yellow printer in the four-color process. Typically, the blue filter exposure would be less than about 15% of the exposure time used for the green filter, with a typical value being about 8% of the total green filter exposure time. It is to be understood that no particular length can be stipulated for the 'normal' exposure time, since that depends on shutter opening, film speed, illumination and other variables. Those skilled in the art will apprecaite what a 'normal' exposure would be.

Likewise, I have found that, for the preparation of the green printer, the red filter exposure time should be no less than a normal red filter exposure time for cyan in the typical four-color process. As a general rule, a red filter exposure of approximately 4% longer than normal provides very satisfactory results. The blue filter exposure for making the green printer is also very much less a blue filter exposure to produce a yellow printer in the standard four-color process, Typically, the blue filter exposure in order to make the green printer would be less than about 10% of the exposure time to the red filter for the green printer, with a typical satisfactory value being about 4% of the total red filter exposure time for the green printer.

A contact screen will be in position against the film for the red filter and green filter exposures, at different rotated positions as is usual. I have found that, for each of the blue filter secondary exposures, the screen can be absent.

In regard to the copying industry, it is well understood that the copying process involves the establishment of a latent electrostatic image on a drum or plate constituting a photoconductive surface, following which a colored "toner" is applied to the image-containing portions of the photoconductive surface, the electrical attraction causing the toner to remain in certain areas and be removed from others, following which the photoconductive surface with the toner is applied against a sheet of paper which picks up the toner as an image. Copiers are known which are capable of color reproduction. These copiers work on a principle similar to that utilized in the four-color separation process described earlier, namely that the photoconductive surface is exposed four times sequentially to the original, each time through a different colored filter. Following each exposure to establish the electrostatic image, a colored toner is applied to the surface, and the sheet is printed with that particular color. Then the surface is cleaned, exposed again to the next filter, then the next toner is applied, and the same sheet is again printed with the new color. This continues for all four colors.

It will be evident that the essence of this invention can be applied to the copying industry, by arranging to have the photoconductive surface exposed through not one but two filters for each of the printings. These filters ideally would be used sequentially to build up an electrostatic image which is a composite of the images which would normally be obtained through the two different colored filters. Then this composite electrostatic image is contacted by the appropriate colored toner, and the same is printed on the paper sheet.

It will be appreciated that this development, in its broadest aspect, can be described as the making of a "true color" printer by the utilization of more than one filter. Specifically, a common denominator of every utilization of this process would be the manufacture of a "warm" red printer utilizing an exposure through a green filter and a substantially shorter exposure through a blue filter.

The important point to bear in mind is that the present method does not utilize the conventional four-color process inks magenta, cyan, yellow or black. This concept of utilizing a true color ink (for example a warm red or a true green) would normally not occur to one skilled in the printing industry art, because practitioners have become so used to thinking in terms of magenta, cyan, yellow and black.

A further distinction can be drawn between this process and the conventional manufacture of the black printer in the normal four-color process. It is pointed out earlier in this specification that the black printer can typically be made by a multiple exposure to the red, green and blue filters. However, the aim of this conventional multiple-filter exposure technique is to obtain a film, and from the film a printer, for printing only where there is an absence of light, i.e. the black or deeply shaded areas. There is a very great difference between this manufacture of a black printer and the multiple-filter technique of the present development, in which two filters are carefully chosen to yield, not black, but a true color which is not a process color.

A general survey of the prior art of interest to the present development includes the following:
U.S. Pat. No. 3,253,917, issued May 1966 to Flynn;
U.S. Pat. No. 611,457, issued Sept. 1898 to McDonough;
U.S. Pat. No. 930,689, issued Aug. 1909 to Rheinberg;
U.S. Pat. No. 3,376,133, issued Apr. 1968 to Roteman.
"Multicolor Effects on Two Color Presses" Dupont Magazine, September–October., 1968, Vol. 62, No. 5, E. I. Dupont de Nemours, Wilmington, Del.
The Lithographers Manual, Vol. I, January, 1958, Waltwin Publishing Co., New York 36, N.Y. TR 940 S6 1958 c-4: pages 6:10; 6:11; 7:29; 7:39; 7:40; 7:41.

The Lithographers Manual mentioned above discloses the use of multi-filtering techniques for conventional process colors and for black masks and the like, but does not discuss or disclose the present procedure aimed at producing two balanced printers for two true, non-process colors by utilizing a multiple filter technique involving a supplementary blue filter exposure.

It is emphasized again that the interposition of actual colored filters between the original and a means for recording an optical image (such as a piece of film) is not the only way to create the appropriate printer. The presently available scanner machines accomplish the same effect by illuminating the original with light of a particular color. In the appended claims, reference is made to "making a . . . filter exposure", etc., and it is to be understood that this wording is intended to embrace those techniques which do not actually require a physical filter to be interposed, but which achieve exactly the same effect as if the filter had been interposed.

EXAMPLE

The following materials and parameters represent a typical application of the method provided herein:
Film: Panchromatic #2568.
Lights: Pulsating Xenon, four of them, 1500 watts each.
Screen: A gray 100 line contact screen. Lens opening: F22.

| Filters | | |
|---|---|---|
| Colour | Number | Screen Angles |
| Red | 23A | 105° |
| Green | 58 | 45° |
| Panatone Inks (may be Translucent, Transparent or Semi-opaque) | | |
| Green: | 342C | |
| Red: | 185C | |
| Blue: | 280C (to be used to print Red-Blue instead of Red-Green) | |

| Exposure times | | |
|---|---|---|
| FILTER | TIMES | |
| Red 23A | 22 seconds | produces green printer |
| Blue 47B | 1 second | |
| Green 58 | 48 seconds | produces red printer |
| Blue 47B | 3.5 seconds | |

(The blue exposures may be done without the contact screen).

Development times and procedures are standard. Instructions are usually provided with the film itself.

While one embodiment of this invention has been described above, it will be evident to those skilled in the art that changes and modifications may be made therein without departing from the essence of this invention, as set forth in the appended claims.

The embodiments of the invention in which an exclusive property or privilage is claimed are defined as follows:

1. A method of printing on a sheet member a realistic reproduction of a colored original, utilizing a minimum of two different superimposed impressions, each with a different coloring medium, comprising:
(a) providing a colored original,
(b) creating a first printing plate intended to print a non-process red color, by
  (1) making a green filter exposure of the original on a first means for recording a first optical image,
  (2) making a blue filter exposure of the original on said first means,
steps (1) and (2) being carried out sequentially in any order, (c) creating a second printing plate intended to print a second color different from that printed by said first plate, by
  (3) making a red filter exposure of the original on a second means for recording a second optical image,
  (4) making a blue filter exposure of the original on said second means,
steps (3) and (4) being carried out sequentially in any order,
(steps (b) and (c) being carried out in any order,
(d) providing a sheet member to receive two superimposed impressions, and
(e) using said first and second printing plates to print said red color and said different color, respectively, as the said superimposed impressions on said sheet member.

2. The method claimed in claim 1, in which the second color is non-process green.

3. The method claimed in claim 1, in which the second color is a non-process blue.

4. The method claimed in claim 1, in which the second color is non-process black.

5. The method claimed in claim 1, in which each printing plate is a photoconductive surface in a reproduction system using electrostatic images created by exposure to light, and a plurality of toners.

6. The method claimed in claim 5, in which the same photoconductive surface is used sequentially to provide the two printing plates.

7. The method claimed in claim 6, in which the green filter exposure time under step (b)(1) is no less than a normal exposure time for making a magenta printing plate in the conventional four color process; in which the blue filter exposure time under step (b)(2) is less than 15% of the expsoure time under step (b)(1); in which the red filter exposure time under step (c)(3) is no less than a normal exposure time for a making a cyan printing plate in the conventional four color process; and in which the blue filter exposure time under step (c)(4) is less than 10% of the exposure time under step (c)(3).

8. The method claimed in claim 7, in which the second color is chosen from the group: non-process green, non-process blue, non-process black.

9. The method claimed in claim 1, in which said first and second means are two pieces of photographic film exposed through filters to the illuminated original, the printed colors being made by translucent colored printing inks.

10. The method claimed in claim 9, in which the exposure time for the green filter under step (b)(1) is no less than a normal exposure time for making a magenta printing plate in the conventional four color process; in which the exposure time for blue filter under step (b)(2) is less than 15% of the exposure time under step (b)(1); in which the exposure time for the red filter under step (c)(3) is no less than a normal exposure time for making a cyan printing plate in the conventional four color process; and in which the exposure time for the blue filter under step (c)(4) is less than 10% of the exposure time under step (c)(3).

11. The method claimed in claim 10, in which the second color is chosen from the group: non-process green, non-process blue, non-process black.

* * * * *